United States Patent [19]

Chen et al.

[11] Patent Number: 5,510,157
[45] Date of Patent: Apr. 23, 1996

[54] METHOD OF PRODUCING DIAMOND OF CONTROLLED QUALITY

[75] Inventors: Chia-Fu Chen, Hsinchu, Taiwan; Kazuhito Nishimura, Osaka, Japan; Ensei Ko, 835-2, Nishi Koiso, Oiso-machi, Naka-gun, Kanagawa-ken, Japan; Hiroshi Ishizuka, Tokyo, Japan; Satoru Hosomi, Hiratsuka, Japan

[73] Assignees: Ishizuka Research Institute, Ltd.; Ensei Ko, both of Kanagawa; Osaka Diamond Industrial Co., Ltd., Osaka, all of Japan

[21] Appl. No.: 789,441

[22] Filed: Nov. 6, 1991

Related U.S. Application Data

[63] Continuation of Ser. No. 494,750, Mar. 16, 1990, abandoned.

[30] Foreign Application Priority Data

Mar. 17, 1989 [JP] Japan ..................... 1-67228
Mar. 31, 1989 [JP] Japan ..................... 1-83378

[51] Int. Cl.⁶ ................................... C01B 31/06
[52] U.S. Cl. .................. 427/577; 427/249; 117/86; 423/446
[58] Field of Search ............... 423/446, DIG. 5; 156/DIG. 68; 204/157.43, 157.44; 117/86; 427/249, 577

[56] References Cited

U.S. PATENT DOCUMENTS

| | | | |
|---|---|---|---|
| 4,767,608 | 8/1988 | Matsumoto et al. | 156/DIG. 68 |
| 4,932,331 | 6/1990 | Kurihara et al. | 423/446 |
| 4,985,227 | 1/1991 | Ito et al. | 423/446 |

FOREIGN PATENT DOCUMENTS

| | | | |
|---|---|---|---|
| 288065 | 10/1988 | European Pat. Off. | 423/446 |
| 213612 | 12/1983 | Japan | 423/446 |
| 62-223095 | 3/1986 | Japan | 423/446 |
| 2070295 | 3/1987 | Japan | 423/446 |
| 1-83378 | 3/1989 | Japan . | |
| 1-67228 | 3/1989 | Japan . | |

OTHER PUBLICATIONS

Field, J. E. (Ed), *The Properties of Diamond*, Part I, Chapter 5, "Cathodoluminescence", pp. 165–181, Academic Press, New York (1979) (no month).

*Primary Examiner*—Michael Lewis
*Assistant Examiner*—Stuart L. Hendrickson
*Attorney, Agent, or Firm*—Larson and Taylor

[57] ABSTRACT

Making a diamond substance exhibiting a cathodoluminescence spectrum with the peak at a photon energy greater than 2.8 eV (electron volt), the half-value and 20%-value width not exceeding 0.5 eV and 0.8 eV, respectively, comprising: providing a substrate in a closed chamber, introducing a matrix gas comprising $H_2$ and one selected from hydrocarbon and CO to said chamber, exciting the gas to create a plasma while heating said substrate to a temperature of at least 700° C. and, thus, causing deposition and growth of diamond substance which is crystallographically diamond, controlling parameters of the deposition by means of the cathodoluminescence record and recovering the diamond substance from the chamber.

28 Claims, 6 Drawing Sheets

METHOD OF PRODUCING DIAMOND OF CONTROLLED QUALITY

This application is a continuation, of application Ser. No. 07/494,750, filed Mar. 16, 1990, now abandoned.

This invention relates to a synthesis of diamond, or a physically and crystallographically diamond substance (simply referred to as "diamond" hereinafter) by chemical vapor deposition (CVD) and, more in particular, to a method of producing such substance, film or particle, of controlled quality of, for example, type IIa or IIb which is adaptable to optical or electronic applications as well as other advanced technology.

Diamond synthesis by CVD processes, in which a matrix gas containing a carbonaceous material such as a hydrocarbons, ketones and alcohols, is activated by micro- or RF wave induction or heat radiation and diamond is deposited therefrom, exhibit easier capability to control operation parameters and can produce products of wider area than high pressure techniques. Thus there is possibility of forming a wear resistant coating on tools and, further, producing better controlled crystallographical quality such that the diamond would find applications in optics and electronics among others.

It is desired that diamond for such advanced technology should exhibit crystallographical and physical properties controlled properly so it can be well adapted to specific uses. Thus diamond as a material of heat sink, optical window or semiconductor should exhibit the least level of both impurity concentration and structural disorder in order to secure the best thermal, optical or electrical properties. On the other hand, a diamond imparted with consistent semiconducting or electrical properties will be favored as a wear resistant material of electronic instruments.

Diamond and diamond-like products (referred to as "diamond") by CVD processes are commonly studied by X-ray diffraction or Raman spectrum; the former appears to be suitable especially for the identification as diamond, while the latter, for detecting amorphous carbon. Thus these techniques are not effective for examining the crystallographical completeness of the deposit.

The crystallographically complete diamond can be produced at a rate of up to several tens of microns per hour by suppressing contamination by co-depositing graphite or amorphous carbon, the material of any electrode or heating device for exciting the matrix gas placed inside the reaction chamber, substrate material and matrix gas.

Although fluctuation in some parameters, such as the composition, pressure and temperature of matrix gas may cause an increase in contaminant level or structural disorder, which often is significant to end uses but beyond the detection limit of the standard techniques of X-ray diffractometry or Raman spectroscopy. Then the product quality can be estimated and judged only indirectly by the consistency of indication of the flowmeter, pressure gauge or wattometer.

It is known that diamond can be imparted with conductivity or semiconductivity by adding metallic boron dopant to the starting material for a high pressure process or a hydrate of dopant to the matrix gas for a CVD process. As there is no method known for examining a minor mass of diamond for the electrical property, the latter only could be checked by actually testing after a sufficient mass of the product has been accumulated.

In the meantime CL (cathodoluminescence) technique is used for the examination and classification of raw natural diamonds according to the level of impurity concentration and structural disorder, as the luminescence observed by irradiating a diamond specimen with an electron beam carries much information on the structural deficiency, growth layer distribution, and some other crystallographical structural features. The principle and practice of the technique is specifically described in the Synthetic Diamond Techniques Handbook, pp. 232-, published by Science Forum, Japan (1989).

It has been found that the crystallographical completeness and electrical property and, especially, conductivity are revealed by some parameters of an optical cathodoluminescence spectrum from a CVD diamond substance.

Based on this finding, an object of the present invention is to provide a method of efficiently producing an entirely, homogeneous CVD diamond by inspecting the product concerning CL and, accordingly, optimizing and maintaining process parameters.

Another object is to provide a method of producing type IIa diamond by CVD.

Another object is to provide a method of producing semiconducting type IIb diamond.

Another object is to provide an improved method of characterizing synthetic diamond.

BRIEF DESCRIPTION OF THE DRAWINGS

FIGS. 4 and 5 show the CL spectroscopic results for product of the invention and reference, respectively, while

In the invention the matrix gas for producing type IIa and other quality can be of various composition of either $H_2$-CO or $H_2$-hydrocarbon, such as $H_2$-$CH_4$, system without or with a minor proportion of additives such as $O_2$, $CO_2$ and $H_2O$. The $H_2$-$CH_4$ system matrix gas comprises 100 volume parts of $H_2$ and at least 1 part of $CH_4$ on volume basis per unit time. For other hydrocarbons, the matrix gas should be so composed as to exhibit a carbon to hydrogen ratio greater than 1/200. It can comprise further a minor amount of additive, such as $O_2$, $CO_2$ and $H_2O$ singly or in combination, with the atomic ratio of additive oxygen to hydrogen being greater than 2/100.

At a concentration higher than 15 parts of CO to 100 parts of $H_2$, the $H_2$-CO matrix as should preferably comprise one or more of such additives at an atomic ratio of additive oxygen to hydrogen being greater than 5/100. An addition at least of 3 parts of $O_2$, 5 parts of $CO_2$ or 5 parts of $H_2O$ has been found particularly effective for achieving a high deposition efficiency.

It is preferable that a product be examined while the process is carried out; since there is a significant difference in both chamber arrangement and operating pressure between the examination and deposition, it appears more practical that the process is regularly interrupted and the product is transferred to the CL examination chamber.

Anyway the CL evaluation which takes less than 20 minutes, is done conveniently by image analyzing the spectrum record and comparing with a control spectrum in terms of parameters such as the wave length (and intensity value, if desired) of the peak, half-value and 20%-value width, which are defined as the difference between two wave length or photon energy values corresponding to half and 20% the peak value of CL intensity, respectively.

For use as a heat sink material, for example, a type II a diamond is preferably produced. This can be characterized approximately with a CL spectrum with the only peak at about 2.8 eV, as well as half- and 20% value width of or less than 0.5 and 0.8 eV, respectively.

The CL examination is so sensitive: in a case an idiomorphic, or well faceted, diamond was deposited and identified completely as diamond by XRD and Raman spectroscopy, while the CL spectrum revealed a flaw by exhibiting an increase to 0.9 eV in 20%-value width due, apparently, to the superimposition of an emission of band A or H3 center.

Figure 1:
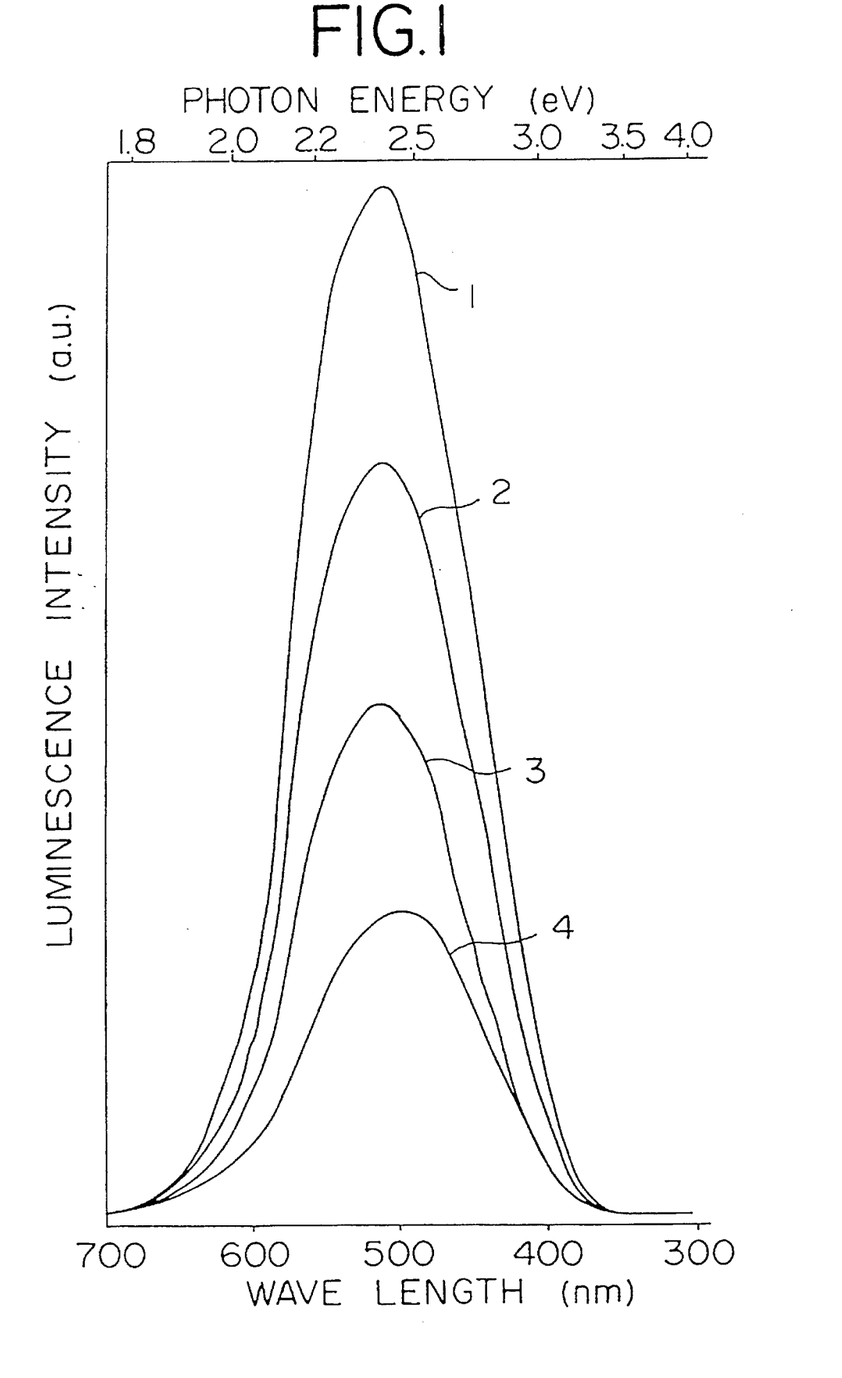
FIG. 1 shows the variation of CL spectrum with boron dopant concentration of CVD diamond.

A semiconducting type IIb diamond can be deposited from the matrix gas containing further a dopant additive or additives, such as $B_2H_6$, $H_2S$, $PH_3$, $AlH_3$ HCl, $AsH_3$ or $H_2Se$. The resulting diamond exhibits a spectrum which varies significantly with the level of electrical conductivity and, thus, dopant concentration. Thus FIG. 1 shows the spectrum variation for a boron doping with $B_2H_6$. Here luminescence intensity in arbitrary unit (ordinate) is plotted against either photon energy in eV or wave length in nm (abscissa). Curves 1 to 4 refer to matrix gas flows (per minute) and boron to carbon proportion of.

199 ml of $H_2$+20 ml of CO, 20 p.p.m. of boron, 195 ml of $H_2$+20 ml of CO, 100 p.p.m. of boron, 175 ml of $H_2$+20 ml of CO, 500 p.p.m. of boron, and 150 ml of $H_2$+20 ml of CO, 1000 p.p.m. of boron respectively. The product characteristic can be checked by comparing with the peak parameters for the control. As a type IIb diamond the photon energy of the peak should be at between 2.4 and 2.5 eV, while the half- and 20%-value width be within 180 and 150%, the specification for the type IIa, or 0.9 and 1.2 eV, respectively.

Figure 2:
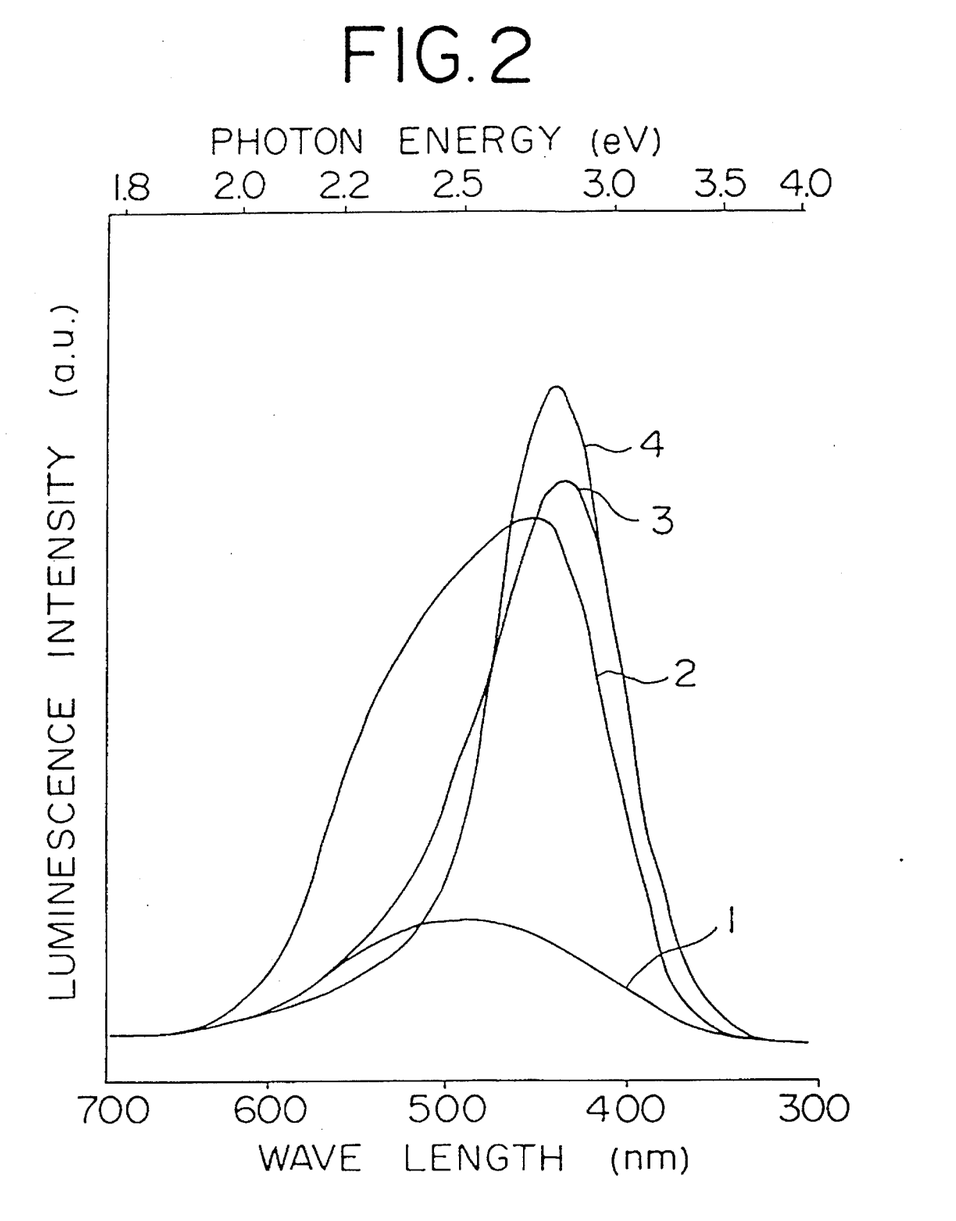
FIGS. 2 and 3 show, respectively, the CL- and Raman spectroscopic results for the diamond products formed at different pressure levels.
Figure 3:
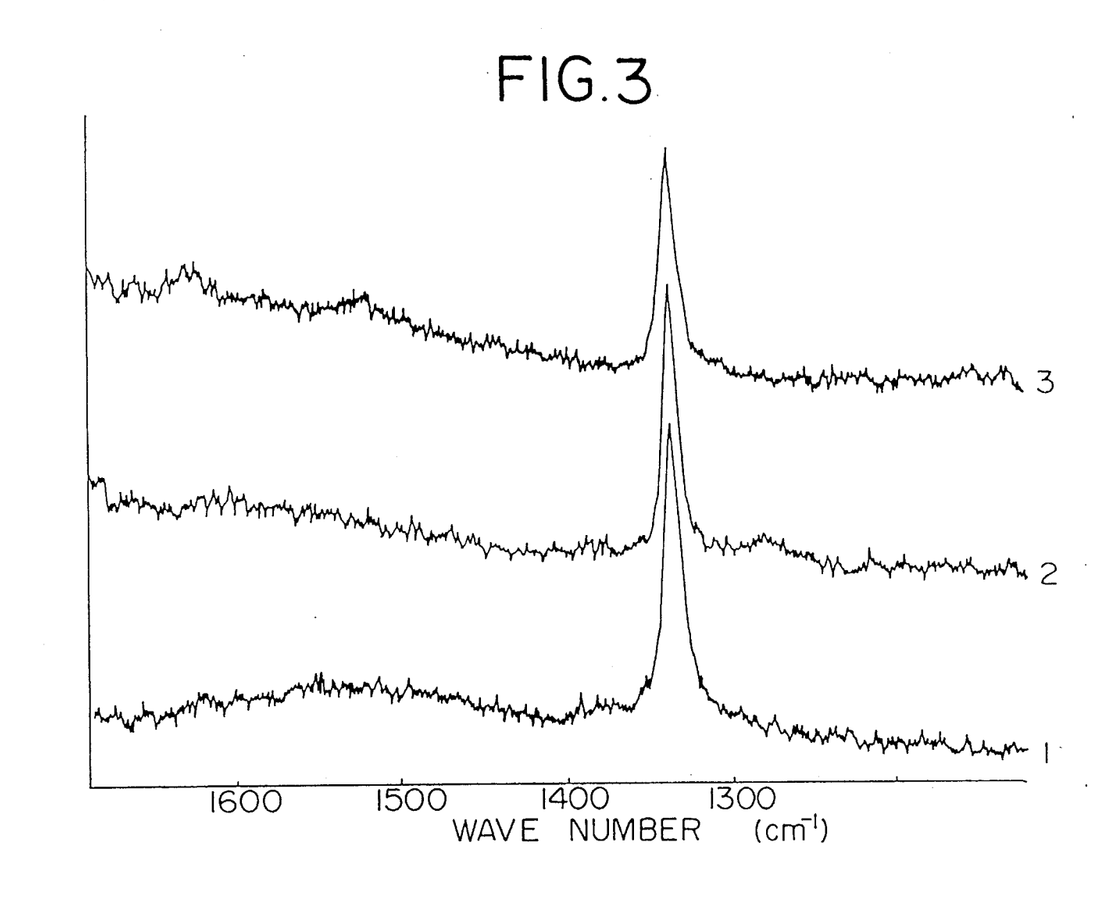

The CL spectroscopy is also sensitive and effective for detecting pressure variation during the process. FIG. 2 as well as the table below show the variation of spectrum with pressure from 3.3 down to 1.3 kPa, where curves 1 to 4 refer to the cases of 1.3, 2.0, 2.7 and 3.3 kPa, respectively, while FIG. 3 shows Raman spectroscopic results, with curves 1 to 3 referring to the cases of 1.3,

| Pressure kPa | Peak eV | HVW eV | 20% VW eV |
|---|---|---|---|
| 3.3 | 2.83 | 0.51 | 0.81 |
| 2.7 | 2.82 | 0.60 | 1.03 |
| 2.0 | 2.74 | 0.84 | 1.12 |
| 1.3 | 2.52 | 0.90 | 1.22 |

2.0 and 2.7 kPa. respectively. As FIG. 2 and the table indicate, the product quality lowers steeply with decreasing-pressure, there is little difference in Raman records in FIG. 3 for the same specimens.

In the above description the 20% value width is employed as a characterizing parameter; it may be obvious, however, that the "20%" level can be replaced, if necessary, with a comparable level of, say, 18 or 25%.

Thus the deposit is taken from the deposition chamber in an early stage of the process (30 minutes after the start, for example) and regularly at times during the process for the cathodoluminescence examination.

If the initial spectrum record meets the specification, the process can be continued as considered operating properly; if not, parameters are modified and regulated so that the spectrum comes closer to the control. Such initial checking allows to save time and cost by preventing from going through an wasteful process until a significant mass of deposit is produced. Or in repeated runs it allows to check the reproducibility of process parameters.

Later checking allows to modify operation parameters, so the desired quality can be maintained.

Product quality can be related with corresponding process parameters for optimization in terms of deposition rate.

The matrix gas should be activated by micro or RF wave in order to minimize contamination by any material placed in the deposition chamber. Thus the use of an electroresistive heater or electrode should be avoided.

The substrate temperature should not exceed 950° C. for preventing contamination by diffusion of the material. However a temperature less than 700° C. results in an unfavorably slow deposition. Practically, temperatures between 800° and 900° C. are preferable.

EXAMPLE 1

A 10×10 mm sheet of silicon was scratched with diamond powder, placed on a carrier of circular quarts 15 mm across, and then raised to the position, in the quartz tube 48 mm across at the center.

While passing a mixed gas of composition listed in the table below (given in parts relative to 100 parts of $H_2$ on volume basis), a 2.45 GHz microwave was transmitted from the magnetron, which was operating at 220 W, to the chamber to heat the substrate to 900° C. Pressure was maintained at about 3.3 kPa in the chamber by controlled degassing. The product quality evaluation is compared in the table, as well as the deposition rate.

Figure 4:
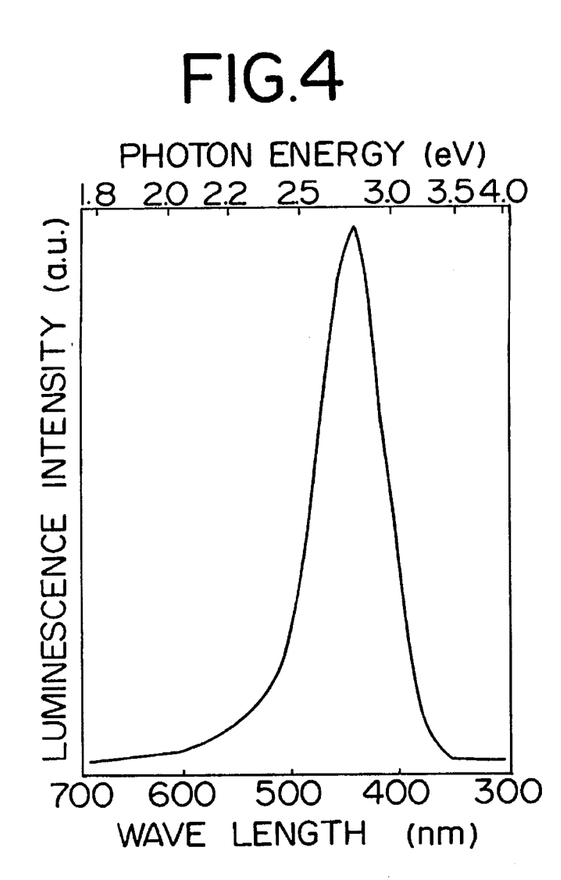
Figure 5:
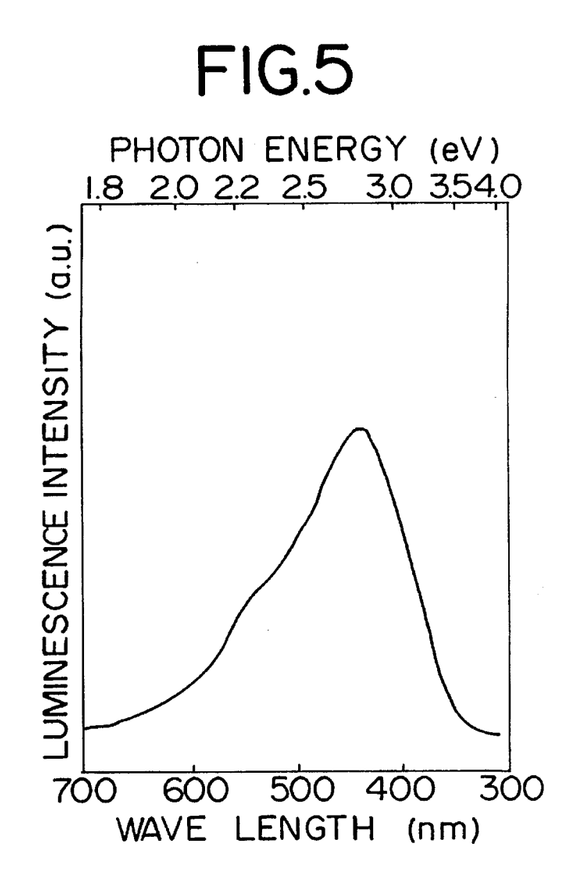
Figure 6:
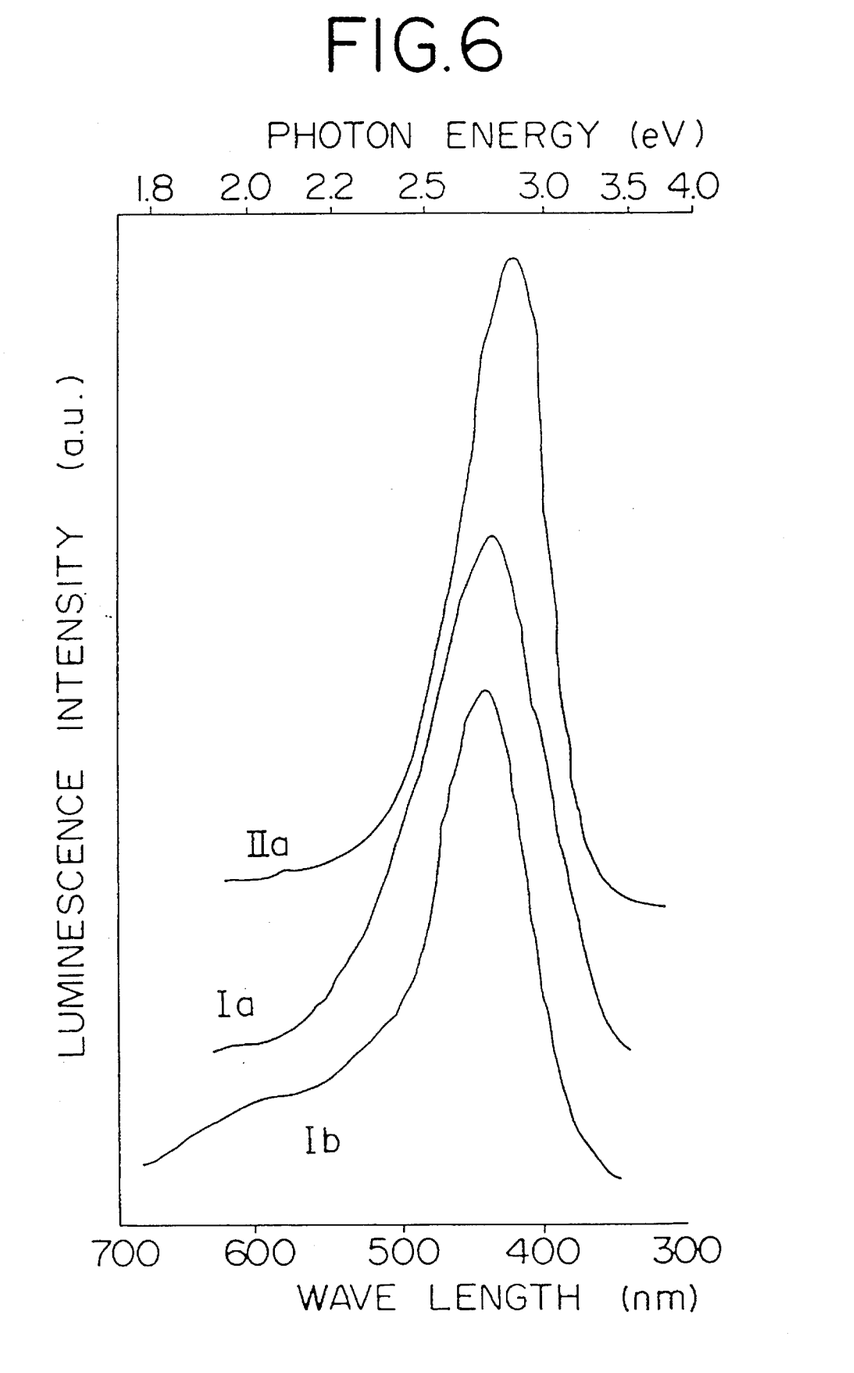
FIG. 6 shows CL spectra for different types of natural diamond.

FIGS. 4, 5 and 6 show the CL spectra taken with a JSM 810 SE microscope for a product of the invention (run No. 6), and a reference product (run No. 10) and a natural diamond, respectively. The ordinate represents luminescence intensity (in arbitrary unit) and the abscissa, photon energy (eV) or wave length (NM).

Figure 7:
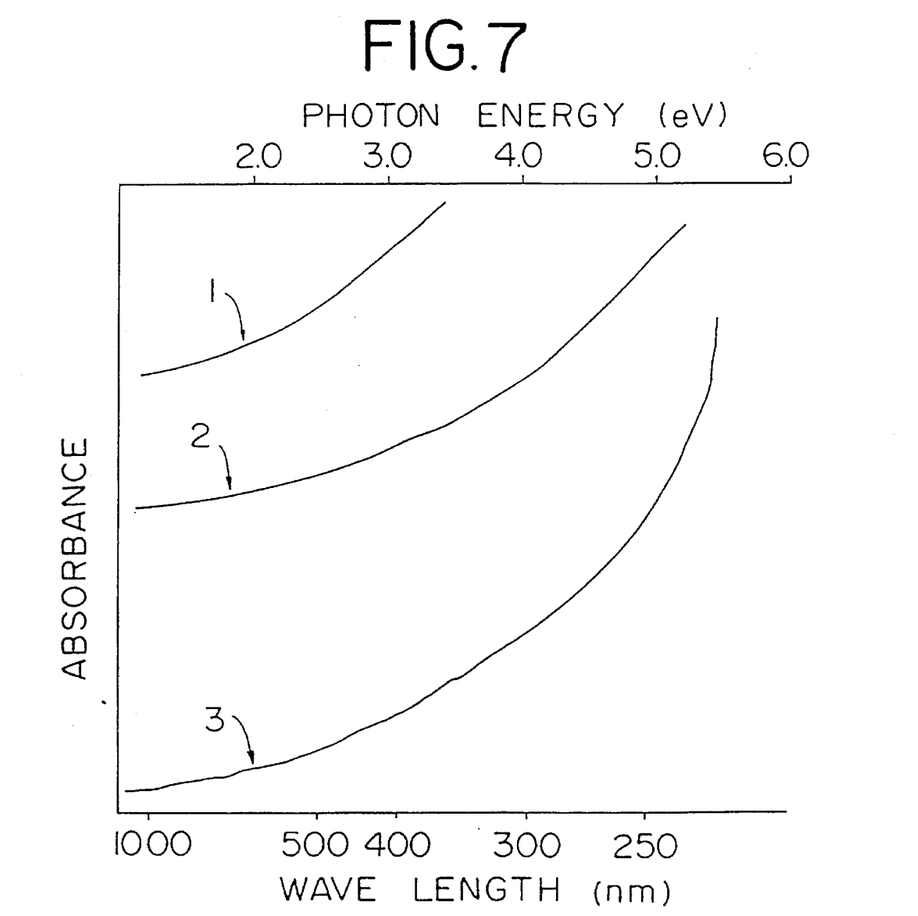
FIG. 7 shows absorbance of another product of the invention, reference and type IIa natural diamond.

FIG. 7 compares optical absorption between invention (run No. 6) and reference (No. 7) products and a type IIa natural diamond, where absorbance is plotted against wave length (nm). The figure indicates that the invention product (curve 2), like the natural type IIa (curve 3), transmits a light of wave length in the vicinity of 300 nm. In contrast, the reference product, as a type Ia diamond, absorbs a light of wave length less than 350 nm as curve 1 indicates.

| Run No. | Matrix gas compostn. | | | | De-postn. rate μ/hr | CL parameters in eV | | |
|---|---|---|---|---|---|---|---|---|
| | $CH_4$ | CO | $O_2$ | $CO_2$ | | Peak | HVW | 20% VW |
| Invention | | | | | | | | |
| 1 | 0.6 | — | — | — | 0.4 | 2.80 | 0.5 | 0.8 |
| 2 | 3 | — | 1.5 | — | 0.9 | 2.80 | 0.45 | 0.70 |
| 3 | 3 | — | — | 2 | 1.4 | 2.83 | 0.5 | 0.65 |
| 4 | — | 10 | — | — | 1.0 | 2.83 | 0.45 | 0.75 |
| 5 | — | 50 | 4 | — | 1.5 | 2.80 | 0.43 | 0.70 |
| 6 | — | 50 | — | 7 | 2.5 | 2.80 | 0.45 | 0.60 |
| reference | | | | | | | | |
| 7 | 1.2 | — | — | — | 0.7 | 2.80 | 0.80 | 1.00 |
| 8 | 3 | — | — | — | 1.4 | 2.75 | 1.1 | 1.35 |
| 9 | — | 30 | — | — | 1.5 | 2.80 | 0.60 | 0.95 |
| 10 | — | 50 | — | — | 2.0 | 2.80 | 0.85 | 1.35 |

EXAMPLE 2

The cycle of the above example was repeated with the same arrangement. 100 ml of $H_2$ and 3 ml of $CH_4$ per minute were begun to be supplied in mix at a pressure of 3.3 kPa. 30 minutes later, the product was taken out of the chamber and examined and diagnosed by CL spectrum, and compared with the standard spectrum which specifies the peak position at 2.7 eV or more, a half- and 20% value width not exceeding 1.1 eV and 1.5 eV, respectively. Meeting with these criteria, the process was continued for further 3 hours and, as a result, a 10 micron thick diamond film was obtained.

EXAMPLE 3

The same arrangement as in the above examples was used with a similar substrate, which was heated to about 830° C. 100 ml of $H_2$, 3 ml of $CH_4$ and 3 ml of CO per minute were begun to be supplied in mix at a pressure of 3.3 kPa. 30 minutes later, the product was taken out of the chamber and diagnosed by CL spectrum, and compared with the standard spectrum. Meeting the specification of the peak position at 2.8 eV or more, the half- and 20% value width not exceeding 0.8 eV and 1.2 eV, respectively, the process was continued for further 3 hours to form a diamond film.

EXAMPLE 4

The same arrangement as above was used with similar substrate, which was heated to about 900° C. 100 ml of $H_2$, 50 ml of CO and 4ml of $CO_2$ per minute were begun to be supplied in mix at a pressure of 3.3 kPa. 30 minutes later, the product was diagnosed by CL spectrum, and compared with the standard spectrum. Meeting the specification of the peak position at 2.7 eV or more, the half- and 20% value width not exceeding 0.5 eV and 0.9 eV, respectively, the process was continued for further 5 hours to form a 10 micron thick diamond film.

EXAMPLE 5

The same arrangement as above was used but that a type Ia natural diamond was used as a substrate, which was heated to about 900° C. 200 ml of $H_2$ and 1 ml of $CH_4$ per minute, added with $B_2H_6$ to a B/C ratio of 100 p.p.m., were begun to be supplied in mix at a pressure of 3.3 kPa. Process parameters were maintained such that the deposit spectrum exhibits a peak position between 2.40 and 2.45 eV, a half- and 20% value width not exceeding 0.75 and 1.1 eV. The product of 5 micron thick film with a bluish color, typical to the type IIb diamond, exhibited a resistivity of 5 ohm. cm as tested by a four terminal method.

As described above in detail, the method of the present invention permits:

(1) to diagnose the product and, thus, process parameters at an early stage of the process, to see if the process is adequate for the desired quality. Thus time and cost can be saved by avoiding going through an wasteful process until a significant mass of deposit is produced. In repeated runs it allows to check the reproducibility of process parameters.

(2) by regularly examining the deposit, to check any deviation short after it happens, so optimal process apartment can be maintained for the most part. Homogeneous products can be thus secured.

(3) to prepare a quality map by relating product evaluation results with corresponding process parameters, whereby parameter settings can be optimized.

I claim:

1. A method of producing a diamond substance of known acceptable quality by chemical vapor deposition, said known acceptable quality being indicated by the cathodoluminescence spectrum of a control diamond substance having said acceptable quality, which method comprises:

a) providing a substrate in a chemical vapor deposition chamber;

b) depositing a diamond substance on said substrate by chemical vapor deposition, said depositing comprising:
      i. introducing into said chamber a matrix gas comprising hydrogen and at least one additional gas selected from a hydrocarbon gas and carbon monoxide;
      ii. exciting said matrix gas to create a plasma while heating said substrate to a temperature of least 700° C. to deposit a diamond substance on said substrate, said substance being crystallographically diamond;

c) terminating said deposition at an early stage after commencing said deposition before a significant mass of said diamond substance has been deposited on said substrate, the amount of deposited diamond substance being sufficient to enable measurement of the luminescence spectrum of said diamond substance by cathodoluminescence measurement;

d) removing said substrate bearing said diamond substance from said chamber;

e) subjecting said diamond substance to a cathodoluminescence measurement to determine the luminescence spectrum of said diamond substance;

f) comparing, utilizing the luminescence measurement of step (e), the luminescence spectrum of said diamond substance to the luminescence spectrum of said control diamond substance of said acceptable quality, the luminescence spectrum of said control diamond substance being indicative of a diamond substance of said acceptable quality whereby the comparison provides an indication of any deviation in said deposited diamond substance from said acceptable quality;

g) returning said substance bearing said diamond substance, to said chemical vapor deposition chamber;

h) depositing additional diamond substance on said substance by chemical vapor deposition according to step b);

i) adjusting, based on the comparison of step f), one or more of the pressure, substrate temperature, or matrix gas composition prevailing in step h) to compensate for deviation from acceptable quality indicated by the comparison of step f); and j) repeating steps c) through i) to produce a significant mass of said diamond substance of said acceptable quality.

2. The method of claim 1, wherein said matrix gas comprises a system of $H_2$ and $CH_4$ and an oxygen containing additive.

3. The method of 2, wherein said matrix gas comprises 100 volume parts by volume $H_2$, 1 or more parts by volume $CH_4$, said oxygen-containing additive comprises at least one of the group consisting of $O_2$, $CO_2$ and $H_2O$ and the atomic ratio of oxygen to hydrogen in said matrix gas is greater than 2/100.

4. The method of claim 3, wherein said matrix gas comprises 1.5 or more parts by volume of $O_2$ for every 100 parts by volume $H_2$.

5. The method of claim 3, wherein said oxygen containing additive comprises 1 or more parts by volume of $CO_2$ for every 100 parts by volume $H_2$.

6. The method of claim 3, wherein said additive comprises 1 or more parts by volume $H_2O$ for every 100 parts by volume $H_2$.

7. The method of claim 3, wherein said matrix gas further comprises a hydrogen containing additive selected from the group consisting of $B_2H_6$, $H_2S$, $PH_3$, $AlH_3$, HCl, and $H_2Se$.

8. The method of claim 7, wherein said matrix gas comprises $B_2H_6$ at a boron/carbon ratio not exceeding 1,000 ppm.

9. The method of claim 1, wherein said matrix gas comprises 15 or less parts by volume CO for every 100 parts by volume of $H_2$.

10. The method of claim 1, wherein said matrix gas comprises $H_2$, CO and an oxygen containing additive.

11. The method of claim 10, wherein said matrix gas comprises 15 or more parts by volume CO for every 100 parts by volume $H_2$, said additive comprises at least one of the group selected from $O_2$, $CO_2$, and $H_2O$, and the atomic ratio of oxygen to hydrogen in said matrix gas is greater than 5/100.

12. The method of claim 11, wherein said oxygen-containing additive comprises 3 or more parts by volume $O_2$ for every 100 parts by volume $H_2$.

13. The method of claim 11, wherein said additive comprises 5 or more parts by volume of $CO_2$ for every 100 parts by volume $H_2$.

14. The method of claim 11, wherein said oxygen-containing additive comprises 5 or more parts by volume of $H_2O$ for every 100 parts by volume $H_2$.

15. The method of claim 1, wherein said matrix gas comprises $H_2$ and CO and a hydrogen containing additive selected from the group consisting of $B_2H_6$, $H_2S$, $PH_3$, $AlH_3$, HCl, $AsH_3$, $H_2Se$.

16. The method of claim 7, wherein said matrix gas comprises $B_2H_6$ at a boron/carbon ratio not exceeding 1,000 ppm.

17. The method of claim 1, wherein said matrix gas is excited by microwave or RF wave radiation.

18. The method of claim 1, wherein said substrate is heated to a temperature between about 700° C. and 950° C.

19. A method according to claim 1, wherein step e) comprises determining the peak luminescence value and the luminescence spectrum width at two lower luminescence values of the luminescence spectrum of said diamond substance, and wherein step f) comprises comparing said determined luminescence values with, respectively, the peak luminescence value and the luminescence spectrum width at said two lower luminescence values of the luminescence spectrum of said control diamond substance.

20. A method according to claim 19 wherein the higher of said lower luminescence values comprise a half-peak luminescence value.

21. A method according to claim 19 wherein said two lower luminescence values comprise a half-peak luminescence value and a of peak luminescence value.

22. A method according to claim 1 wherein said temperature in step b) ii) is not more than about 900° C.

23. A method according to claim 1 wherein said temperature in step b) ii) is from 800° C. to 900° C.

24. A method according to claim 21 wherein the luminescence spectrum of said control diamond substance has:

a peak value at a photron energy level of about 2.8 ev;

a half-peak width of about 0.5 ev; and a 20% of peak width of about 0.8 ev.

25. A method according to claim 21 wherein the luminescence spectrum of said control diamond substance has:

a peak value at a photron energy level of between about 2.4 and 2.5 ev;

a half-peak width of about 0.9 ev; and a 20% of peak width of about 1.2 ev.

26. A method according to claim 1 wherein step i) comprises adjusting said matrix gas composition.

27. A method according to claim 1 wherein step i) comprises adjusting said pressure.

28. A method according to claim 1 wherein step i) comprises adjusting said substrate temperature.

* * * * *